(12) United States Patent
Adusumilli et al.

(10) Patent No.: US 10,651,281 B1
(45) Date of Patent: May 12, 2020

(54) SUBSTRATES WITH SELF-ALIGNED BURIED DIELECTRIC AND POLYCRYSTALLINE LAYERS

(71) Applicant: GLOBALFOUNDRIES Inc., Grand Cayman (KY)

(72) Inventors: Siva P. Adusumilli, South Burlington, VT (US); John J. Ellis-Monaghan, Grand Isle, VT (US); Anthony K. Stamper, Williston, VT (US); Ian McCallum-Cook, Burlington, VT (US); Mark Goldstein, Essex Junction, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/207,915

(22) Filed: Dec. 3, 2018

(51) Int. Cl.
| | |
|---|---|
| *H01L 29/32* | (2006.01) |
| *H01L 29/66* | (2006.01) |
| *H01L 29/786* | (2006.01) |
| *H01L 21/265* | (2006.01) |
| *C23C 16/48* | (2006.01) |

(Continued)

(52) U.S. Cl.
CPC ............ *H01L 29/32* (2013.01); *C23C 16/402* (2013.01); *C23C 16/481* (2013.01); *H01L 21/266* (2013.01); *H01L 21/26533* (2013.01); *H01L 21/26586* (2013.01); *H01L 21/76243* (2013.01); *H01L 21/76267* (2013.01);
(Continued)

(58) Field of Classification Search
CPC ... H01L 29/04; H01L 29/32; H01L 21/26533; H01L 21/76243; H01L 21/76267; H01L 29/66772; H01L 21/26586; H01L 21/76289; H01L 29/78603; H01L 21/266
See application file for complete search history.

(56) References Cited

U.S. PATENT DOCUMENTS

| | | | | | |
|---|---|---|---|---|---|
| 3,622,382 | A | * | 11/1971 | Brack ............... | H01L 21/26533 428/448 |
| 3,830,668 | A | * | 8/1974 | Dearnaley ............... | H01L 21/00 438/480 |

(Continued)

OTHER PUBLICATIONS

Steven M. Shank et al., "Bulk Substrates With a Self-Aligned Buried Polycrystalline Layer", filed Mar. 26, 2018 as U.S. Appl. No. 15/935,606.

*Primary Examiner* — Scott B Geyer
(74) *Attorney, Agent, or Firm* — Thompson Hine LLP; Anthony Canale

(57) ABSTRACT

Structures with altered crystallinity beneath semiconductor devices and methods associated with forming such structures. A semiconductor layer is implanted over a first depth range of an inert gas species to modify the crystal structure of a semiconductor material of the semiconductor layer and form a first modified region. The semiconductor layer is annealed with a first annealing process to convert the semiconductor material within the first modified region to a non-single-crystal layer. The semiconductor layer is also implanted with ions of an element over a second depth range to modify the crystal structure of the semiconductor material of the semiconductor layer and form a second modified region containing a concentration of the element. The semiconductor layer is annealed with a second annealing process to convert the semiconductor material within the second modified region to an insulator layer containing the element.

20 Claims, 5 Drawing Sheets

(51) Int. Cl.
  *H01L 21/762* (2006.01)
  *C23C 16/40* (2006.01)
  *H01L 29/04* (2006.01)
  *H01L 21/266* (2006.01)

(52) U.S. Cl.
  CPC ........ *H01L 21/76289* (2013.01); *H01L 29/04* (2013.01); *H01L 29/66772* (2013.01); *H01L 29/78603* (2013.01)

(56) References Cited

U.S. PATENT DOCUMENTS

| | | | | |
|---|---|---|---|---|
| 4,053,925 A * | 10/1977 | Burr | .................. | H01L 21/26506 257/376 |
| 4,788,608 A | 11/1988 | Tsujisawa | | |
| 5,198,371 A * | 3/1993 | Li | .................... | H01L 21/26506 438/475 |
| 5,429,955 A * | 7/1995 | Joyner | ............. | H01L 21/76243 438/766 |
| 5,488,004 A | 1/1996 | Yang | | |
| 5,508,211 A * | 4/1996 | Yee | .................. | H01L 21/26506 438/400 |
| 5,589,407 A | 12/1996 | Meyyappan et al. | | |
| 6,110,845 A * | 8/2000 | Seguchi | ............. | H01L 21/2026 438/795 |
| 6,617,034 B1 * | 9/2003 | Hamaguchi | ....... | H01L 21/26533 428/446 |
| 6,833,322 B2 | 12/2004 | Anderson et al. | | |
| 8,324,031 B2 * | 12/2012 | Tan | .................... | H01L 21/26506 438/152 |
| 2006/0281233 A1 * | 12/2006 | Aoki | ................ | H01L 21/76243 438/149 |
| 2008/0251879 A1 * | 10/2008 | Adachi | ............. | H01L 21/26533 257/506 |
| 2009/0321874 A1 * | 12/2009 | Aoki | ................ | H01L 21/76243 257/506 |
| 2010/0323502 A1 * | 12/2010 | Takeno | ............ | H01L 21/76243 438/480 |
| 2013/0075784 A1 * | 3/2013 | Ikeda | .................. | H01L 27/0727 257/140 |
| 2015/0206758 A1 * | 7/2015 | Kato | .................... | H01L 21/265 438/459 |
| 2015/0270132 A1 * | 9/2015 | Laven | ................ | H01L 21/2253 257/607 |
| 2016/0005622 A1 * | 1/2016 | Iwasaki | ................ | H01L 21/263 257/617 |
| 2016/0322220 A1 * | 11/2016 | Reznicek | ........... | H01L 29/1054 |
| 2017/0069625 A1 * | 3/2017 | Hirabayashi | ........ | H01L 29/1095 |
| 2017/0133227 A1 * | 5/2017 | Kajiwara | .......... | H01L 21/26513 |
| 2017/0271447 A1 * | 9/2017 | Tamura | ................ | H01L 29/739 |
| 2018/0269063 A1 * | 9/2018 | Kodama | ............ | H01L 21/0275 |
| 2019/0304829 A1 * | 10/2019 | Tsai | .................... | H01L 21/7624 |

* cited by examiner

US 10,651,281 B1

SUBSTRATES WITH SELF-ALIGNED BURIED DIELECTRIC AND POLYCRYSTALLINE LAYERS

BACKGROUND

The present invention relates to semiconductor device fabrication and integrated circuits and, more specifically, to structures with altered crystallinity beneath semiconductor devices and methods associated with forming such structures.

Bulk silicon substrates are less costly than silicon-on-insulator (SOI) substrates. Generally, an SOI substrate includes a thin device layer of silicon, a handle substrate, and a thin buried oxide (BOX) layer physically separating and electrically isolating the device layer from the handle substrate. Devices fabricated using SOI technologies may exhibit certain performance improvements in comparison with comparable devices built in a bulk silicon substrate. For example, in contrast to an SOI substrate, a bulk silicon substrate is characterized by poor device isolation from harmonic generation.

Improved structures that provide the advantages of an SOI substrate absent the cost and methods of forming such structures are needed.

SUMMARY

In an embodiment of the invention, a structure includes a non-single-crystal layer in a semiconductor layer, an insulator layer in the semiconductor layer and spaced in a vertical direction from the non-single-crystal layer. The non-single crystal layer contains polycrystalline semiconductor material, a plurality of defects, and an inert gas species.

In an embodiment of the invention, a method includes implanting a semiconductor layer with ions of an inert gas species over a first depth range to modify the crystal structure of a semiconductor material of the semiconductor layer and form a first modified region, and annealing the semiconductor layer with a first annealing process to convert the semiconductor material within the first modified region to a non-single-crystal layer. The method further includes implanting the semiconductor layer with ions of an element over a second depth range to modify the crystal structure of the semiconductor material of the semiconductor layer and form a second modified region containing a concentration of the element, and annealing the semiconductor layer with a second annealing process to convert the semiconductor material within the second modified region to an insulator layer containing the element.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
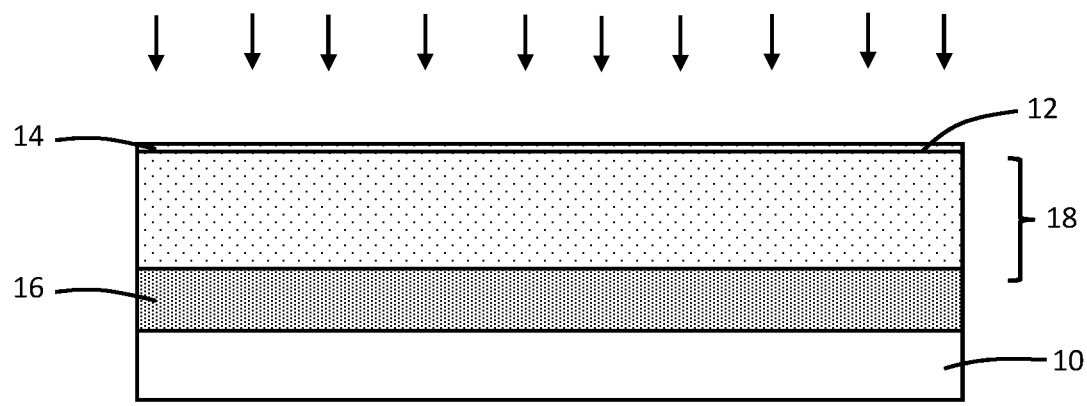
FIGS. 1-5 are cross-sectional views of a structure at successive fabrication stages of a processing method in accordance with embodiments of the invention.

With reference to FIG. 1 and in accordance with embodiments of the invention, a semiconductor layer 10 may include a top surface 12 and an optional screen layer 14 on the top surface 12. The semiconductor layer 10 may be a bulk wafer composed of single-crystal silicon. The screen layer 14 may be composed of a dielectric material, such as silicon dioxide, deposited by chemical vapor deposition (CVD) or formed by thermal oxidation. In an alternative embodiment, the semiconductor layer 10 may be a silicon-on-insulator (SOI) handle wafer or a thick-film top silicon film of an SOI wafer.

A modified region 16 is formed by ion implantation in the semiconductor layer 10 and has a depth profile that extends over a depth range in the semiconductor layer 10. The depth profile of the modified region 16 is located at a given depth beneath the top surface 12 of the semiconductor layer 10. The modified region 16 includes an inert gas species introduced by the implanted ions and damage to the single-crystal semiconductor material of the semiconductor layer 10 caused by the implantation. A portion 18 of the semiconductor layer 10 between the modified region 16 and the top surface 12 of the semiconductor layer 10 is also damaged during the ion implantation. The semiconductor layer 10 may be undamaged at depths located beyond the depth profile of the modified region 16 and remain single crystal.

The ion implantation performed to form the modified region 16 introduces energetic ions, as indicated diagrammatically by the single-headed arrows, with ion trajectories that penetrate through the screen layer 14 and that stop over the depth range in the semiconductor material of the semiconductor layer 10. The energetic ions, as they penetrate into the semiconductor layer 10, lose energy via scattering events with atoms and electrons in the semiconductor material of the semiconductor layer 10. Energy lost in nuclear collisions, which dominates at low kinetic energies after energy loss, displaces target atoms of the semiconductor layer 10 from their original lattice sites, which damages the crystal lattice structure of the semiconductor layer 10 and generates point defects over the depth range. The ions stop in the semiconductor layer 10 after the kinetic energy is fully dissipated by the energy loss. The depth profile includes a distribution of the implanted inert gas species with a peak concentration occurring near a projected range of the ions, and a distribution of damage with a peak damage also occurring near the projected range of the ions.

The ions may be generated from a suitable source gas and implanted into the semiconductor layer 10 with selected implantation conditions using an ion implantation tool. The conditions (e.g., ion species, dose, kinetic energy) of each implantation may be selected to tune the characteristics (e.g., depth profile, amount of damage) of the modified region 16. The crystal lattice structure of the semiconductor layer 10 may be damaged over the depth range of the modified region 16 relative to its initial single-crystal state by the damage induced by the implanted ions. In an embodiment, the ions that are implanted as the inert gas species to form the modified region 16 may be generated from argon or another type of noble atom gas or inert gas. The ion dose is selected to be less than a threshold dose beyond which recrystallization of the damaged semiconductor material in the modified region 16 by a subsequent anneal is not possible. In an embodiment, the ion dose may be less than or equal to $1.3 \times 10^{15}$ cm$^{-2}$. In an embodiment, the ion dose may be greater than $1 \times 10^{14}$ cm$^{-2}$. In an embodiment, the ion dose may be within a range extending from $1 \times 10^{13}$ cm$^{-2}$ to $1 \times 10^{15}$ cm$^{-2}$. In an embodiment, multiple implantations of different kinetic energies and doses may be employed to form the modified region 16.

Figure 1A:
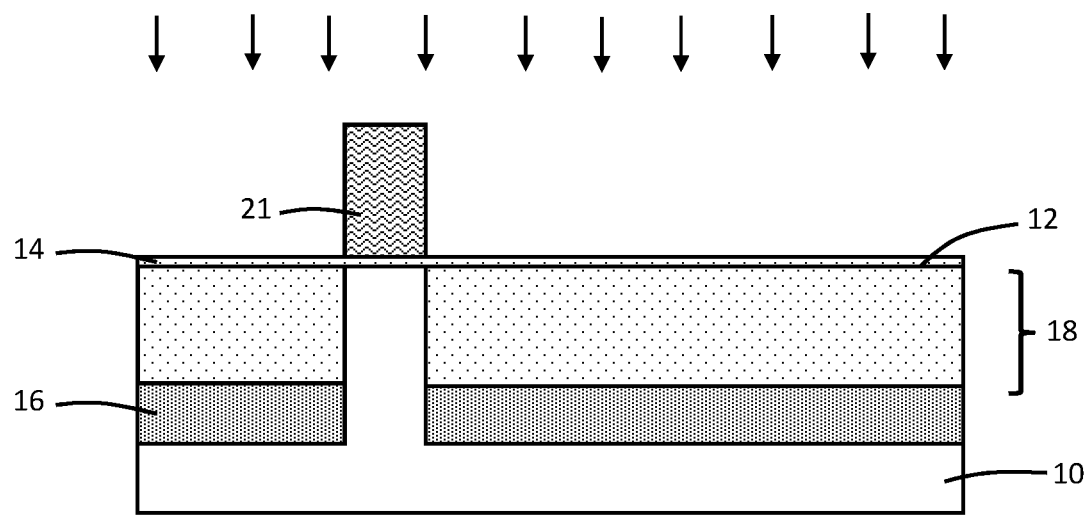
FIGS. 1A and 3A are cross-sectional views of structures in accordance with alternative embodiments of the invention.

As shown in FIGS. 1A and 1n accordance with alternative embodiments, an implantation mask 21 may be formed by lithography over the screen layer 14 before performing the ion implantation. The implantation mask 21 may include a layer of, for example, an organic photoresist that is applied by a spin coating process, pre-baked, exposed to light projected through a photomask, baked after exposure, and developed with a chemical developer. The thickness of the implantation mask 21 is selected such that the ions being implanted are stopped in the implantation mask 21 instead of penetrating into the underlying semiconductor layer 10. Due to ion stopping within the thickness of the implantation mask 21, the modified region 16 (and the subsequently-formed non-single-crystal layer) may include sections separated by a gap in which the single-crystal semiconductor material of the semiconductor layer 10 is not implanted and remains undamaged.

Figure 2:
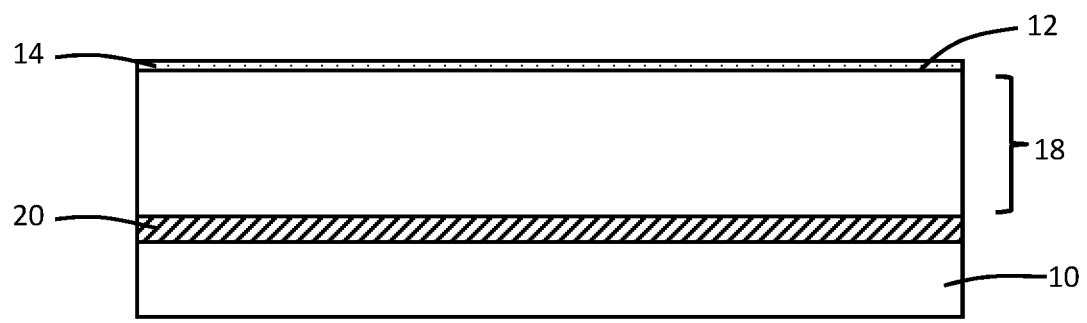

With reference to FIG. 2 in which like reference numerals refer to like features in FIG. 1 and at a subsequent fabrication stage of the processing method, the modified region 16 is subjected to a thermal treatment (i.e., annealing process) that converts the modified region 16 into a non-single-crystal layer 20. In an embodiment, a spike anneal may be performed as the thermal treatment used to convert the modified region 16. In an embodiment, the spike anneal may be a rapid thermal anneal (RTA) performed using, for example, a bank of flash lamps that heat the modified region 16 to a peak temperature in a range of 850° C. to 1125° C. with a dwell time at the peak temperature of 30 milliseconds to 60 seconds and, in a particular embodiment, a dwell time in a range from 30 milliseconds to 10 seconds.

The thermal treatment recrystallizes the implanted and damaged semiconductor material of the modified region 16 into polycrystalline semiconductor material (e.g., polysilicon) that contains defects as residual damage in addition to the grains of the polycrystalline semiconductor material. In particular, the thermal process recrystallizes the semiconductor material of the modified region 16 and thereby converts the modified region 16 to the non-single-crystal layer 20. The single-crystal semiconductor material of the semiconductor layer 10, which is arranged over and beneath the modified region 16, provides the crystalline template for recrystallization. The non-single-crystal layer 20 may be arranged at or near the former location of the peak ion dose and/or peak damage in the semiconductor material of the modified region 16, and portions of the modified region 16 over and beneath the non-single-crystal layer 20 may be recrystallized to form single-crystal semiconductor material. The defects may contain the implanted noble gas or inert gas species (e.g., argon). If multiple kinetic energies were used to implant the modified region 16, then multiple non-single-crystal layers 20, each corresponding to one of the implant depths, would be formed.

The thermal treatment also recrystallizes the damaged semiconductor material in the portion 18 of the semiconductor layer 10 into single-crystal semiconductor material (e.g., single-crystal silicon). The single-crystal portion 18 of the semiconductor layer 10 is arranged between the non-single-crystal layer 20 and the top surface 12 of the semiconductor layer 10.

Figure 3:
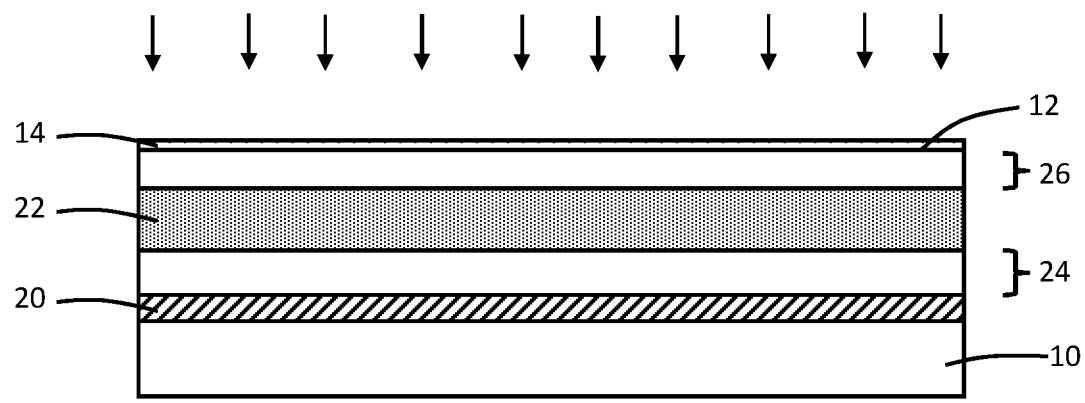

With reference to FIG. 3 in which like reference numerals refer to like features in FIG. 2 and at a subsequent fabrication stage of the processing method, a modified region 22 is formed in the semiconductor layer 10 and has a depth profile that extends over a depth range in the semiconductor layer 10. The depth profile of the modified region 22 is located at a given depth beneath the top surface 12 the semiconductor layer 10. The modified region 22 may be arranged in a vertical direction between the non-single-crystal layer 20 and the top surface 12 of the semiconductor layer 10. The modified region 22 includes an element introduced by the ions of the ion implantation and damage to the single-crystal semiconductor material caused by the ion implantation. A portion 26 of the semiconductor layer 10 between the modified region 22 and the top surface 12 of the semiconductor layer 10 is damaged during the ion implantation. A portion 24 of the semiconductor layer 10 between the modified region 22 and the non-single-crystal layer 20 is located at a greater depth than the modified region 22 and may not be damaged during the ion implantation. The non-single-crystal layer 20, which is also located at a greater depth than the modified region 22, may not be modified by the formation of the modified region 22.

The ion implantation performed to form the modified region 22 introduces energetic ions, as indicated diagrammatically by the single-headed arrows, with ion trajectories that penetrate through the screen layer 14 and that stop over the depth range of the modified region 22 to introduce an implanted element into the semiconductor material of the semiconductor layer 10. The ions stop in the semiconductor layer 10 after their kinetic energy is fully dissipated by the damage-causing energy loss. The depth profile of the modified region 22 includes a distribution of the element with a peak concentration occurring near a projected range of the ions and a distribution of damage with a peak damage occurring near the projected range of the ions.

The ions may be generated from a suitable source gas and implanted into the semiconductor layer 10 with selected implantation conditions using an ion implantation tool. The conditions (e.g., ion species, dose, kinetic energy) of each implantation may be selected to tune the characteristics (e.g., depth profile and amount of damage) of the modified region 22. In an embodiment, the ion species of the ions that are implanted to form the modified region 22 may be generated from molecular oxygen or a gas containing oxygen, which introduces the element oxygen into the crystal structure of the semiconductor layer 10 over the implanted depth range. The ion dose is selected to be less than a threshold beyond which recrystallization of the damaged semiconductor material in the modified region 22 by a subsequent anneal is not possible. In an embodiment, the ion dose may be less than or equal to $3 \times 10^{14}$ cm$^{-2}$. In an embodiment, the ion dose may be within a range extending from $1 \times 10^{13}$ cm$^{-2}$ to $1 \times 10^{15}$ cm$^{-2}$. In an embodiment, multiple implantations of different kinetic energies and doses may be employed to form the modified region 22. The screen layer 14 may be stripped following the implantation.

Figure 3A:
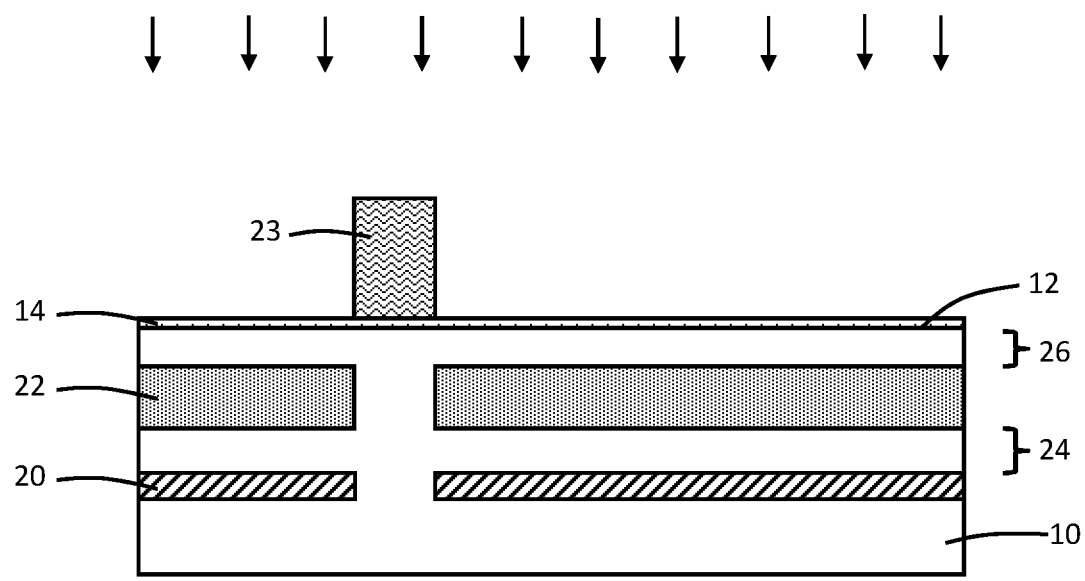

As shown in FIG. 3A and in accordance with alternative embodiments, an implantation mask 23 similar to implantation mask 21 (FIG. 1A) may be formed by lithography over the screen layer 14 before performing the ion implantation. Due to ion stopping within the thickness of the implantation mask 23, the modified region 22 (and the subsequently-formed insulator layer) may include sections separated by a gap in which the single-crystal semiconductor material of the semiconductor layer 10 is not implanted and remains undamaged. The area covered on the top surface 12 covered by the implantation mask 23 may coincide with the area covered by implantation mask 21, as shown, or the covered areas may differ.

Figure 4:
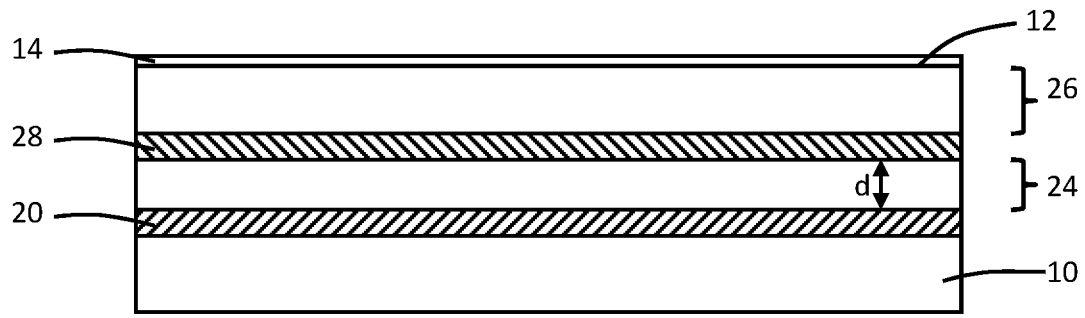

With reference to FIG. 4 in which like reference numerals refer to like features in FIG. 3 and at a subsequent fabrication stage of the processing method, the modified region 22 is subjected to a thermal treatment (i.e., annealing process) that converts the modified region 22 into an insulator layer 28. In an embodiment, a spike anneal may be performed as the thermal treatment used to convert the modified region 22. In an embodiment, the spike anneal may be a rapid thermal anneal (RTA) performed using, for example, a bank of flash lamps that heat the modified region 22 to a peak temperature in a range of 950° C. to 1125° C. with a dwell time at the peak temperature of 30 milliseconds to 60 seconds and, in a particular embodiment, a dwell time in a range from 30 milliseconds to 10 seconds.

The thermal treatment causes the element introduced by ion implantation to combine with atoms of the semiconductor material of the semiconductor layer 10 and form an electrical insulator as a compound that is contained in insulator layer 28. In an embodiment, the thermal treatment recrystallizes the damaged and oxygen-containing semiconductor material of the modified region 22 into an oxide of silicon (e.g., $SiO_x$), such as silicon dioxide or a silicon-rich silicon dioxide. In particular, the thermal process converts the modified region 22 to the insulator layer 28 and also recrystallizes damage in the modified region 22 over and under the insulator layer 28. The surrounding semiconductor material of the semiconductor layer 10 provides the crystalline template for recrystallization. The element introduced by the ion implantation combines with the semiconductor material to form the electrical insulator of the insulator layer 28. The insulator layer 28 may be arranged at or near the former location of the peak ion dose and/or damage in the semiconductor material of the modified region 22, and thicknesses of the modified region 22 above and below the insulator layer 28 may be recrystallized to single-crystal semiconductor material. The insulator layer 28 may function as a buried insulator layer that electrically isolates the overlying thickness of the semiconductor layer 10 from the underlying thickness of the semiconductor layer 10. In alternative embodiments, other elements may be implanted to form the insulator layer 28, such as nitrogen, carbon, a combination of oxygen with nitrogen and/or carbon, or other elements that form a silicon-based insulator (e.g., silicon nitride or silicon carbide) when combined with the semiconductor material of the semiconductor layer 10.

The non-single-crystal layer 20 and the insulator layer 28, as shown in FIG. 4, may be separated by a distance, d. More specifically, the lower edge of the insulator layer 28 and the upper edge of the non-single-crystal layer 20 (i.e., the nearest respective edges) may be separated by the distance, d. In an alternative embodiment, the depth of the modified region 22 may be increased such that the modified region 22 overlaps with the non-single-crystal layer 20, which may result in an overlap in depth between the non-single-crystal layer 20 and the insulator layer 28.

In alternative embodiments, the order of the implantations forming the modified regions 16, 22 may be reversed such that the modified region 22 is formed, and subjected to the heat treatment converting the modified region 22 to the insulator layer 28, before the modified region 16 is formed and subsequently heat treated.

Figure 5:
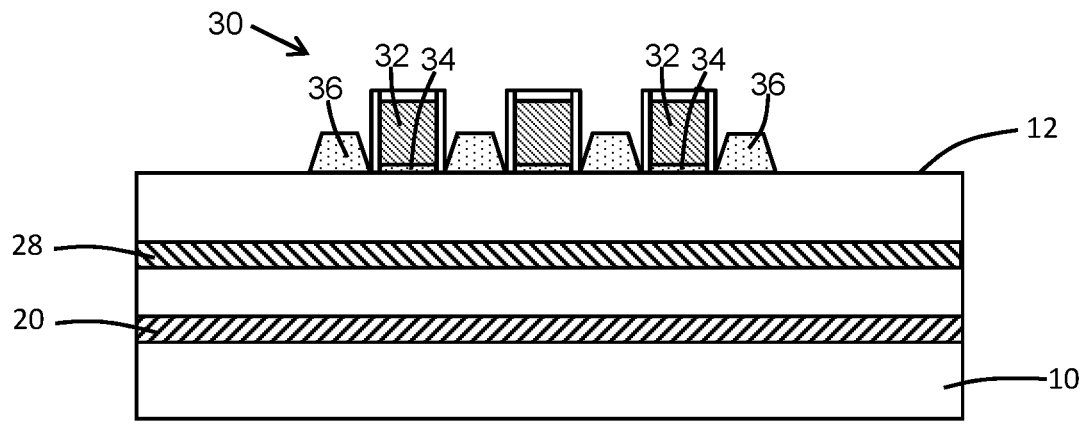

With reference to FIG. 5 in which like reference numerals refer to like features in FIG. 4 and at a subsequent fabrication stage of the processing method, a device structure, generally indicated by reference numeral 30, may be formed by front-end-of-line (FEOL) processing over the non-single-crystal layer 20 and the insulator layer 28. In an embodiment, the device structure 30 may be a field-effect transistor that includes one or more gate fingers each having a gate electrode 32 and a gate dielectric 34. The gate electrode 32 may be composed of a conductor, such as doped polycrystalline silicon (i.e., polysilicon), and the gate dielectric 34 may be composed of an electrical insulator, such as silicon dioxide. The field-effect transistor providing the device structure 30 may include source/drain regions 36 composed of a doped epitaxial semiconductor material (e.g., silicon or silicon-germanium) grown by an epitaxial growth process. As used herein, the term "source/drain region" means a doped region of semiconductor material that can function as either a source or a drain of a field-effect transistor. Middle-of-line (MOL) processing and back-end-of-line (BEOL) processing follow to form an interconnect structure coupled with the device structure 30. The source/drain regions 36 may be silicided to reduce their sheet resistance.

The non-single-crystal layer 20 and/or insulator layer 28 may improve the radiofrequency harmonic suppression in comparison with a structure lacking such layers. The non-single-crystal layer 20 and/or insulator layer 28 permits the semiconductor layer 10 to provide the radiofrequency harmonic suppression without the need for a more-costly silicon-on-insulator wafer. The non-single-crystal layer 20 and/or insulator layer 28 may also improve the linearity of coplanar waveguides formed as structures over the semiconductor layer 10 by suppressing radiofrequency harmonics.

Figure 6:
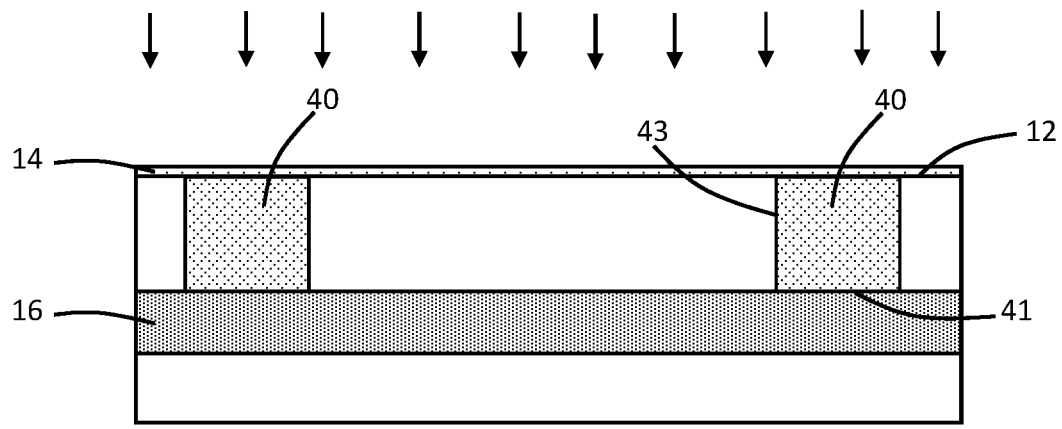
FIGS. 6-7 are cross-sectional views of a structure at successive fabrication stages of a processing method in accordance with alternative embodiments of the invention.

With reference to FIG. 6 in which like reference numerals refer to like features in FIG. 1 and in accordance with alternative embodiments of the invention, shallow trench isolation regions 40 may be formed that extend from the top surface 12 of the semiconductor layer 10 into the semiconductor layer 10 to a bottom surface 41. The shallow trench isolation regions 40 may be composed of a dielectric material, such as an oxide of silicon (e.g., silicon dioxide), deposited by chemical vapor deposition (CVD) into etched trenches, polished, and deglazed.

The shallow trench isolation regions 40 may be formed before performing the implantation that forms the modified region 16. The depth profile of the modified region 16 may be chosen through selection of implantation conditions to overlap in depth with a bottom surface of the shallow trench isolation regions 40 such that the bottom surface 41 and/or a side surface 43 of the shallow trench isolation regions 40 is contiguous with portions of the modified region 16.

Figure 7:
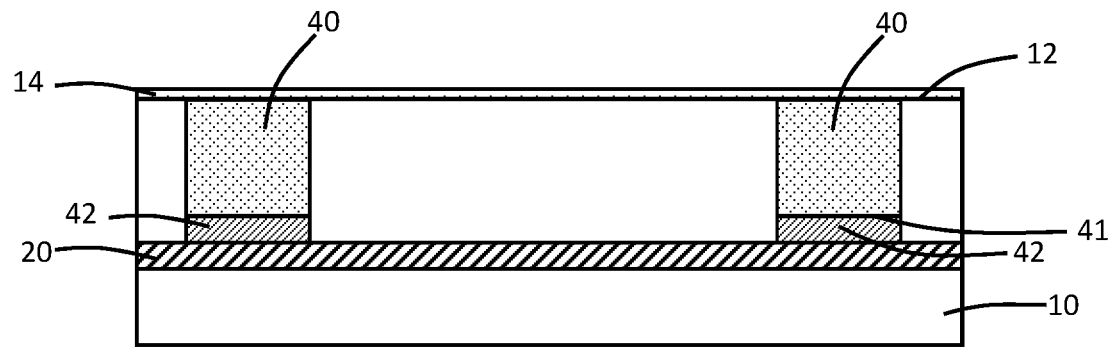

With reference to FIG. 7 in which like reference numerals refer to like features in FIG. 6 and in accordance with alternative embodiments of the invention, a thickness of the modified region 16 between the bottom surface 41 of each shallow trench isolation region 40 and the non-single-crystal layer 20 in the vertical direction is converted during the thermal treatment to a section 42 containing polycrystalline semiconductor material. The shallow trench isolation regions 40 modify the ability to recrystallize the semiconductor material of the modified region 16 over the volume of the sections 42 such that the recrystallized semiconductor material in the sections 42 is polycrystalline with grains and grain boundaries, instead of having a single-crystal crystal structure. The sections 42 may be self-aligned with the shallow trench isolation regions 40, and may have an interface touching the non-single-crystal layer 20, in addition to an interface touching the bottom surface 41 of the shallow trench isolation regions 40, such that direct physical contact is present.

Processing continues as described in connection with FIGS. 3-5. Following the formation of the insulator layer 28 at a shallower depth than the non-single-crystal layer 20, the shallow trench isolation regions 40 interrupt the continuity of the insulator layer 28. The device structure 30 (FIG. 5) may be formed over portions of the non-single-crystal layer 20 and the insulator layer 28 interior of the shallow trench isolation regions 40.

Figure 8:
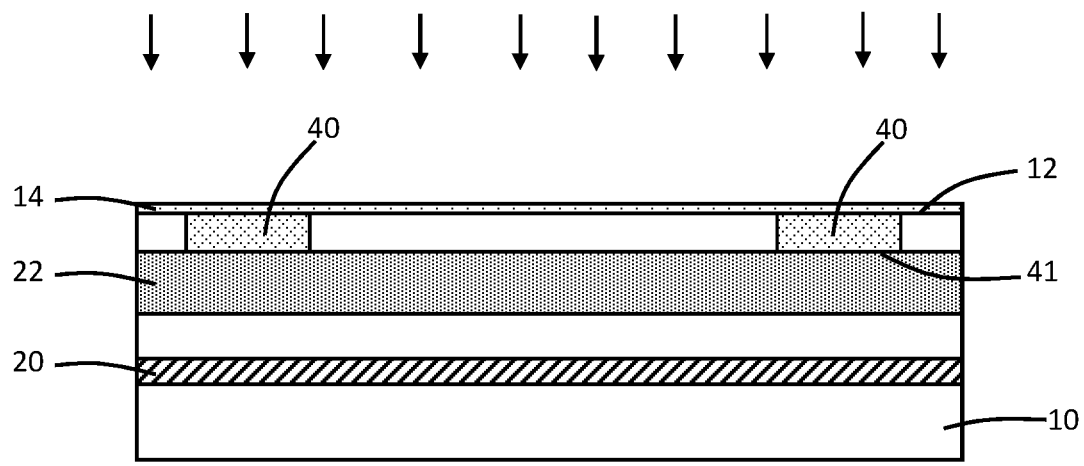
FIGS. 8-9 are cross-sectional views of a structure at successive fabrication stages of a processing method in accordance with alternative embodiments of the invention.

With reference to FIG. 8 in which like reference numerals refer to like features in FIG. 3 and in accordance with alternative embodiments of the invention, the shallow trench isolation regions 40 may be chosen to overlap in depth with the modified region 22 such that the shallow trench isolation regions 40 and portions of the modified region 22 are contiguous. The shallow trench isolation regions 40 are formed before performing the implantation that forms the modified region 22. The depth profile of the modified region 22 may be chosen through selection of implantation conditions to overlap in depth with the bottom surface 41 of the shallow trench isolation regions 40 such that the shallow trench isolation regions 40 are contiguous with portions of the modified region 22.

Figure 9:
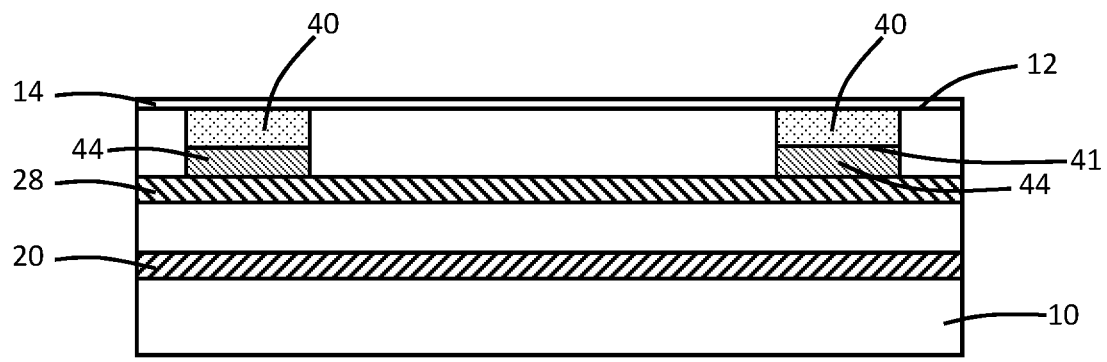

With reference to FIG. 9 in which like reference numerals refer to like features in FIG. 8 and in accordance with alternative embodiments of the invention, a thickness of the modified region 22 between the bottom surface of each shallow trench isolation region 40 and the insulator layer 28 is converted during the thermal treatment to a section 44 containing polycrystalline semiconductor material. The shallow trench isolation regions 40 modify the ability to recrystallize the semiconductor material of the modified region 22 such that the semiconductor material in the sections 44 is polycrystalline with grains and grain boundaries instead of having a single-crystal crystal structure. The sections 44 may be self-aligned with the shallow trench isolation regions 40, and may be arranged in the vertical direction between the insulator layer 28 and the shallow trench isolation regions 40. The sections 44 may have an interface touching the insulator layer 28, in addition to an interface touching the bottom surface 41 of the shallow trench isolation regions 40, such that direct physical contact is present.

Processing may continue as described in connection with FIG. 5.

Figure 10:
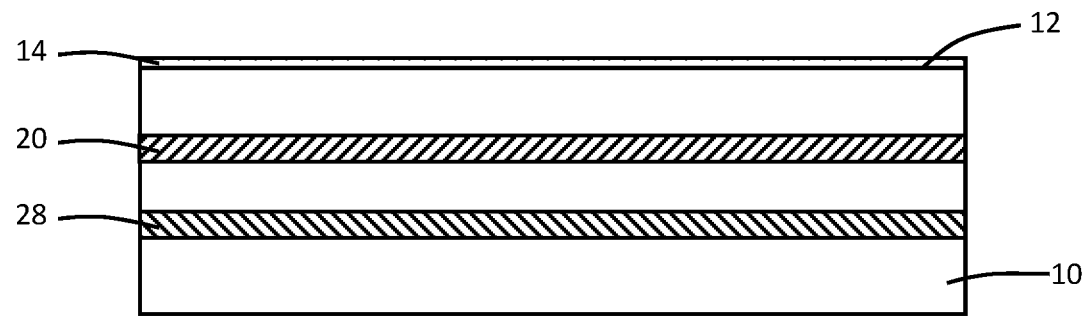
FIGS. 10-12 are cross-sectional views of structures in accordance with alternative embodiments of the invention.

With reference to FIG. 10 in which like reference numerals refer to like features in FIG. 4 and in accordance with alternative embodiments of the invention, the arrangement of the non-single-crystal layer 20 and the insulator layer 28 may be changed such that the non-single-crystal layer 20 is arranged in the vertical direction between the insulator layer 28 and the top surface 12 of the semiconductor layer 10. To that end, the implantation conditions for the implantation forming the modified region 22 and the implantation conditions for the implantation forming the modified region 16 are changed such that the modified region 16 is formed at a greater depth relative to the top surface 12 of the semiconductor layer 10 than the modified region 22. After forming the non-single-crystal layer 20 and the insulator layer 28, processing may continue as described in connection with FIG. 5.

Figure 11:
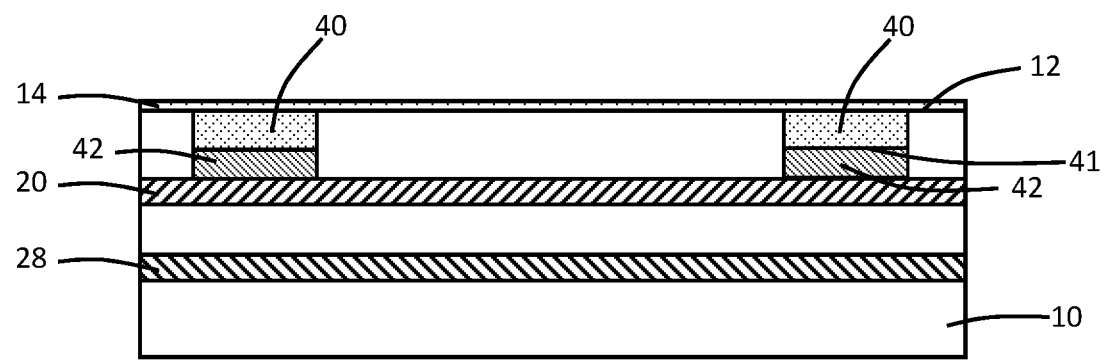

With reference to FIG. 11 in which like reference numerals refer to like features in FIG. 10 and in accordance with alternative embodiments of the invention, the shallow trench isolation regions 40 may be included in the structure and arranged in the semiconductor layer 10 such that the sections 42 are formed between the non-single-crystal layer 20 and the top surface 12 of the semiconductor layer 10.

Figure 12:
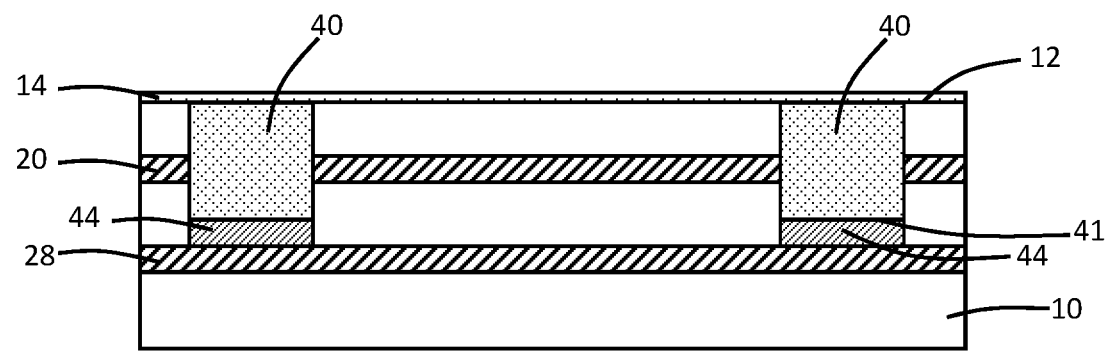

With reference to FIG. 12 in which like reference numerals refer to like features in FIG. 11 and in accordance with alternative embodiments of the invention, the shallow trench isolation regions 40 may be included in the structure and arranged in the semiconductor layer 10 such that the sections 44 are formed between the insulator layer 28 and the top surface 12 of the semiconductor layer 10. The shallow trench isolation regions 40 interrupt the continuity of the non-single-crystal layer 20.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
a semiconductor layer;
a non-single-crystal layer in the semiconductor layer, the non-single-crystal layer containing polycrystalline semiconductor material, a plurality of defects, and an inert gas species; and
an insulator layer in the semiconductor layer and spaced in a vertical direction from the non-single-crystal layer.

2. The structure of claim 1 wherein the semiconductor layer has a top surface, and the non-single-crystal layer is arranged between the insulator layer and the top surface of the semiconductor layer.

3. The structure of claim 1 wherein the semiconductor layer has a top surface, and the insulator layer is arranged between the non-single-crystal layer and the top surface of the semiconductor layer.

4. The structure of claim 1 further comprising:
a trench isolation region having a bottom surface arranged over the non-single-crystal layer; and
a section of polycrystalline semiconductor material arranged between the bottom surface of the trench isolation region and the non-single-crystal layer.

5. The structure of claim 1 further comprising:
a trench isolation region having a bottom surface arranged over the insulator layer; and
a section of polycrystalline semiconductor material arranged between the bottom surface of the trench isolation region and the insulator layer.

6. The structure of claim 1 further comprising:
a field-effect transistor including a gate structure arranged over a top surface of the semiconductor layer, the non-single-crystal layer, and the insulator layer.

7. A method comprising:
implanting a semiconductor layer over a first depth range with ions of an inert gas species to modify a crystal structure of a semiconductor material of the semiconductor layer and form a first modified region;
annealing the semiconductor layer with a first annealing process to convert the semiconductor material within the first modified region to a non-single-crystal layer;
implanting the semiconductor layer with ions of an element over a second depth range to modify the crystal structure of the semiconductor material of the semiconductor layer and form a second modified region containing a concentration of the element; and
annealing the semiconductor layer with a second annealing process to convert the semiconductor material within the second modified region to an insulator layer containing the element.

8. The method of claim 7 wherein the semiconductor layer has a top surface, and the first modified region is arranged between the second modified region and the top surface of the semiconductor layer.

9. The method of claim 8 wherein the non-single-crystal layer is arranged between the insulator layer and the top surface of the semiconductor layer.

10. The method of claim 7 wherein the semiconductor layer has a top surface, and the second modified region is arranged between the first modified region and the top surface of the semiconductor layer.

11. The method of claim 10 wherein the insulator layer is arranged between the non-single-crystal layer and the top surface of the semiconductor layer.

12. The method of claim 7 wherein the element is oxygen, nitrogen, carbon, or a combination thereof, and the insulator layer contains an oxide of silicon, silicon nitride, or silicon carbide.

13. The method of claim 7 further comprising:
a trench isolation region arranged over the first modified region,
wherein the first annealing process recrystallizes a portion of the first modified region to form a section of a polycrystalline semiconductor material arranged between the non-single-crystal layer and the trench isolation region.

14. The method of claim 7 further comprising:
a trench isolation region arranged over the second modified region,
wherein the second annealing process recrystallizes a portion of the second modified region to form a section of a polycrystalline semiconductor material arranged between the insulator layer and the trench isolation region.

15. The method of claim 7 wherein the semiconductor layer is implanted over the first depth range with an ion dose that is in a range of $1\times10^{13}$ cm$^{-2}$ to $1\times10^{15}$ cm$^{-2}$.

16. The method of claim 7 wherein the semiconductor layer is implanted over the second depth range with an ion dose that is in a range of $1\times10^{13}$ cm$^{-2}$ to $1\times10^{15}$ cm$^{-2}$.

17. The method of claim 7 wherein the inert gas species is argon.

18. The method of claim 7 further comprising:
forming a field-effect transistor including a gate structure arranged over a top surface of the semiconductor layer, the non-single-crystal layer, and the insulator layer.

19. The method of claim 7 wherein the first modified region is formed before the second modified region, and the semiconductor layer is annealed with the first annealing process to form the non-single-crystal layer before the semiconductor layer is implanted with the ions of the element over the second depth range to form the second modified region.

20. The method of claim 7 wherein the second modified region is formed before the first modified region, and the semiconductor layer is annealed with the second annealing process to form the insulator layer before the semiconductor layer is implanted over the first depth range to form the first modified region.

* * * * *